(12) United States Patent
Yoshitomi et al.

(10) Patent No.: US 8,928,193 B2
(45) Date of Patent: Jan. 6, 2015

(54) STEPPING MOTOR FOR METER

(75) Inventors: Shoji Yoshitomi, Tokyo (JP);
Katsutoshi Suzuki, Tokyo (JP);
Masatomo Komaki, Tokyo (JP)

(73) Assignee: Minebea Co., Ltd., Nagano (JP)

( * ) Notice: Subject to any disclaimer, the term of this patent is extended or adjusted under 35 U.S.C. 154(b) by 401 days.

(21) Appl. No.: 13/311,978

(22) Filed: Dec. 6, 2011

(65) Prior Publication Data

US 2012/0161552 A1 Jun. 28, 2012

(30) Foreign Application Priority Data

Dec. 24, 2010 (JP) ................................. 2010-287399

(51) Int. Cl.
*H02K 37/12* (2006.01)
*H02K 37/14* (2006.01)
*G01R 7/06* (2006.01)
*H02K 1/28* (2006.01)
*H02K 5/22* (2006.01)
*H02K 7/00* (2006.01)
*H02K 7/14* (2006.01)
*H02K 1/27* (2006.01)

(52) U.S. Cl.
CPC ................ *H02K 37/14* (2013.01); *H02K 37/12* (2013.01); *G01R 7/06* (2013.01); *H02K 1/2733* (2013.01); *H02K 1/28* (2013.01); *H02K 5/225* (2013.01); *H02K 7/003* (2013.01); *H02K 7/14* (2013.01)
USPC ................................... 310/49.02; 310/261.01

(58) Field of Classification Search
USPC ................ 310/43, 49.02, 49.18, 49.32, 261.1
See application file for complete search history.

(56) References Cited

U.S. PATENT DOCUMENTS

| 3,119,941 | A | * | 1/1964 | Guiot | 310/49.17 |
|---|---|---|---|---|---|
| 4,714,850 | A | * | 12/1987 | Akiba et al. | 310/49.14 |
| 5,254,892 | A | * | 10/1993 | Bosman et al. | 310/49.18 |
| 6,224,034 | B1 | * | 5/2001 | Kato et al. | 251/164 |
| 6,404,086 | B1 | * | 6/2002 | Fukasaku et al. | 310/89 |
| 6,674,208 | B2 | * | 1/2004 | Ineson et al. | 310/190 |
| 7,023,123 | B2 | * | 4/2006 | Suzuki et al. | 310/261.1 |

(Continued)

FOREIGN PATENT DOCUMENTS

| JP | 08-009574 A | 1/1996 |
|---|---|---|
| JP | 2004-048892 A | 2/2004 |
| JP | 4145083 B2 | 9/2008 |

OTHER PUBLICATIONS

Japanese Office Action dated May 20, 2014 issued in counterpart JP Patent Application 2010-287399.

*Primary Examiner* — Tran Nguyen
(74) *Attorney, Agent, or Firm* — Carrier Blackman & Associates, P.C.; Joseph P. Carrier; Anne G. Sabourin

(57) ABSTRACT

A stepping motor for a meter to rotate a pointer of a meter, the stepping motor for a meter includes: a rotor part having: a cylindrical magnet; and a rotational shaft, which is hollow and made of a resin, and which is molded on an inner periphery of the cylindrical magnet and is coaxial with the cylindrical magnet; a stator part that contains the rotor part therein and has an excitation coil; a front plate made of a resin, and an end plate made of a resin, wherein a fixing part to fix the cylindrical magnet is molded when molding the rotational shaft, and wherein the cylindrical magnet is fixed by the fixing part so that the cylindrical magnet and the rotational shaft are integrated.

6 Claims, 8 Drawing Sheets

(56) References Cited

U.S. PATENT DOCUMENTS

| | | | |
|---|---|---|---|
| 7,196,444 B2* | 3/2007 | Hata et al. | 310/90 |
| 7,816,819 B2* | 10/2010 | Ohkawa et al. | 310/43 |
| 2001/0026103 A1* | 10/2001 | Suzuki et al. | 310/71 |
| 2004/0012273 A1* | 1/2004 | Suzuki et al. | 310/67 R |
| 2008/0084125 A1* | 4/2008 | Ohkawa et al. | 310/43 |
| 2009/0001826 A1* | 1/2009 | Suzuki et al. | 310/42 |
| 2009/0014673 A1* | 1/2009 | Weldon et al. | 251/129.01 |

* cited by examiner

STEPPING MOTOR FOR METER

CROSS-REFERENCE TO RELATED APPLICATION

This application claims priority from Japanese Patent Application No. 2010-287399 filed on Dec. 24, 2010, the entire subject matter of which is incorporated herein by reference.

TECHNICAL FIELD

This disclosure relates to a stepping motor for a meter, and more specifically, to a stepping motor for a meter for rotating a pointer of a pointer-type meter such as speed meter of an automobile and engine tachometer.

BACKGROUND

Regarding a background stepping motor for a meter, it is known that a stepping motor for a meter, which has a hollow rotational shaft and a light reflection layer coated on an inner side of the rotational shaft to guide light to a leading end of the rotational shaft in high efficiency (refer to JP-B-4145083).

According to the motor disclosed in JP-B-4145083, a pointer attached to the leading end of the rotational shaft is enabled to emit the light, thereby improving visibility of the pointer.

And now, it is required for the above motor to reduce the number of parts or the manufacturing processes so as to realize the low cost.

The motor disclosed in JP-B-4145083 does not consider the above standpoint such as the low cost, so that a configuration having high cost performance is required.

In view of the above, this disclosure provides a stepping motor for a meter having improved cost performance.

SUMMARY

A stepping motor for a meter to rotate a pointer of a meter in this disclosure, the stepping motor for a meter comprising: a rotor part having: a cylindrical magnet; and a rotational shaft, which is hollow and made of a resin, and which is molded on an inner periphery of the cylindrical magnet and is coaxial with the cylindrical magnet; a stator part that contains the rotor part therein and has an excitation coil; a front plate made of a resin, and an end plate made of a resin, wherein a fixing part to fix the cylindrical magnet is molded when molding the rotational shaft, and wherein the cylindrical magnet is fixed by the fixing part so that the cylindrical magnet and the rotational shaft are integrated.

In the above stepping motor for a meter, the rotational shaft may have a hollow hole, of which a cross-sectional shape perpendicular to an axial direction has a polygonal shape, and the pointer may be fitted into the hollow hole of the rotational shaft and may be fixed to the rotational shaft.

In the above stepping motor for a meter, a stopper part may be provided to the rotational shaft, a stopper pin may be provided on a position corresponding to a radial position of the stopper part that is rotated with rotating of the rotational shaft, and the rotation of the rotational shaft may restrained by contacting of the stopper part with the stopper pin.

In the above stepping motor for a meter, the stopper part may be a protruding part protrudes outward in an axial direction, and wherein the stopper pin made of a resin may be inserted in a hole provided to the front plate or end plate so that it protrudes inward in the axial direction, and then the stopper pin may be welded.

In the above stepping motor for a meter, both a penetrated hole provided to the front plate and a penetrated hole provided to the end plate may be configured to function as bearings for supporting the rotational shaft.

In the above stepping motor for a meter, an inner circumferential surface of the hollow rotational shaft may be coated with a light reflection material.

According to this disclosure, following effects are realized.

The rotor structure is integrally molded, so that it is possible to reduce the number of parts, thereby providing the stepping motor for a meter having high cost performance.

In case that the rotational shaft of the motor is a hollow shaft, it is possible to realize the light guiding by the various ways including not only the direct light guiding but also using the optical fibers inserted into the hollow and the like. Also, it is possible that the inner circumferential surface of the rotational shaft is coated with a reflective material and the like to effectively guide the light.

In case that the inner periphery of the hollow rotational shaft is polygonally shaped, after attaching the motor to a rear of a dashboard, it is easily possible to attach the pointer and to detach the pointer for repair and the like. Further, the fixing and fastening force of the pointer to the hollow rotational shaft are also stabilized.

In case that the stopper part is integrally molded when molding the rotor, it is possible to reduce the number of the manufacturing processes and to improve the position accuracy, thereby contributing to the improvement on the productivity.

In case that the stopper pin provided, which receives the stopper part, is made of resin, it is possible that the stopper pin is fixed to the front plate or end plate made of resin by welding, after a motor rotation inspection (which inspects whether the motor rotates without a problem). Thereby, it is possible to detect a problem (for example, the motor is not rotated) during the manufacturing, so that it is possible to prevent the inferior goods from being distributed.

According to this disclosure, it is possible to provide the configuration having improved the cost performance.

BRIEF DESCRIPTION OF THE DRAWINGS

The foregoing and additional features and characteristics of this disclosure will become more apparent from the following detailed descriptions considered with the reference to the accompanying drawings, wherein:

FIGS. 4A and 4B illustrate a rotor magnet of the stepping motor for a meter shown in FIG. 1, wherein FIG. 4A illustrates a perspective view of the rotor magnet and FIG. 4B illustrates a sectional view taken along a line IVB-IVB of FIG. 4A;

FIGS. 5A, 5B, and 5C illustrate a rotor of the stepping motor for a meter shown in FIG. 1, wherein FIG. 5A illustrates a side view as viewed from an attachment side of a front plate 5, FIG. 5B illustrates a sectional view taken along a line VB-VB of FIG. 5A and FIG. 5C illustrates a sectional view taken along a line VC-VC of FIG. 5A;

FIGS. 7A and 7B illustrates a state in which the stepping motor for a meter shown in FIG. 1 is mounted on a substrate, wherein FIG. 7A illustrates a front view as viewed from the pointer and FIG. 7B illustrates a side view.

DETAILED DESCRIPTION

Hereinafter, illustrative embodiments of this disclosure will be described with reference to the drawings.

Figure 1:
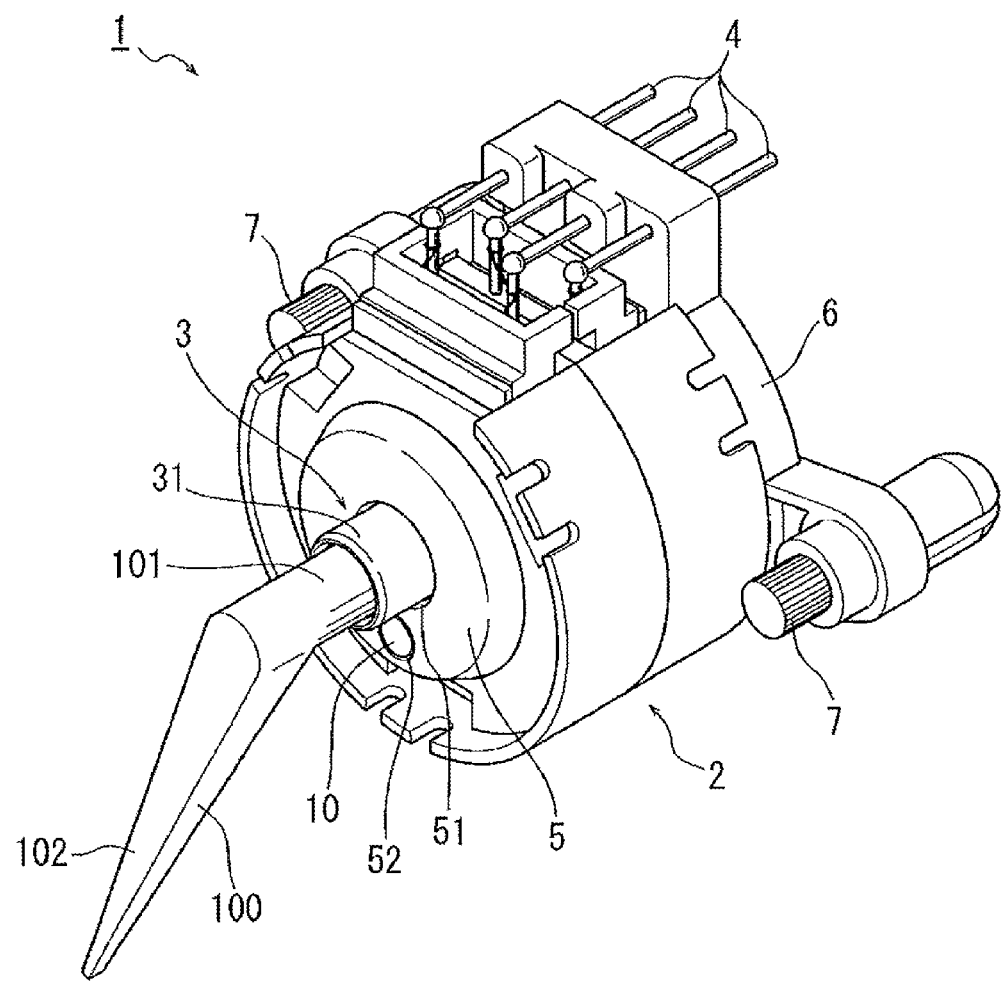
FIG. 1 is a perspective view illustrating an illustrative embodiment of a stepping motor for a meter according to this disclosure.

FIG. 1 is a perspective view illustrating an illustrative embodiment of a stepping motor for a meter according to this disclosure.

Figure 2:
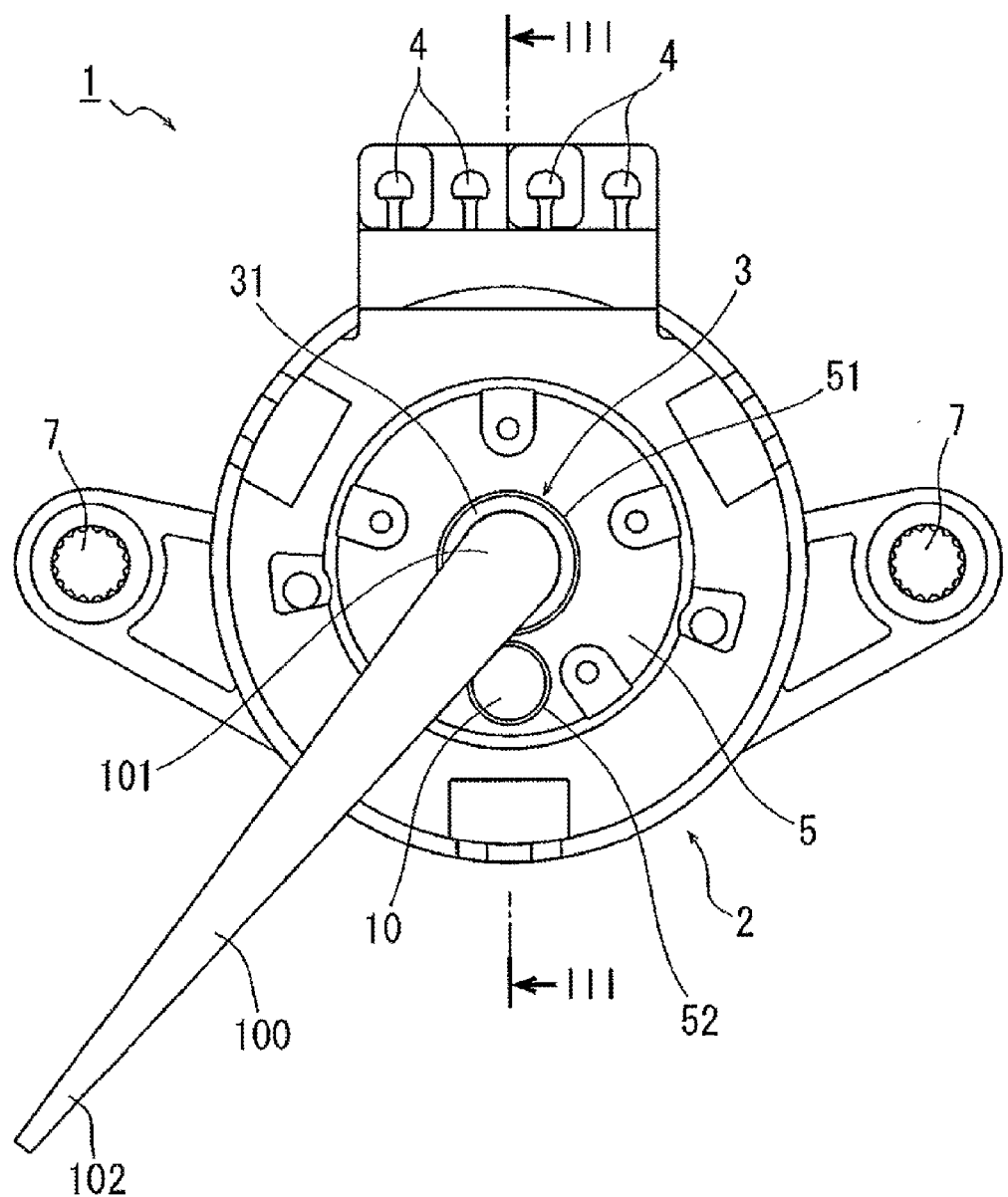
FIG. 2 illustrates a front view as viewed from a pointer of the stepping motor for a meter of FIG. 1.

Also, FIG. 2 illustrates a front view as viewed from a pointer of the stepping motor for a meter of FIG. 1.

Figure 3:
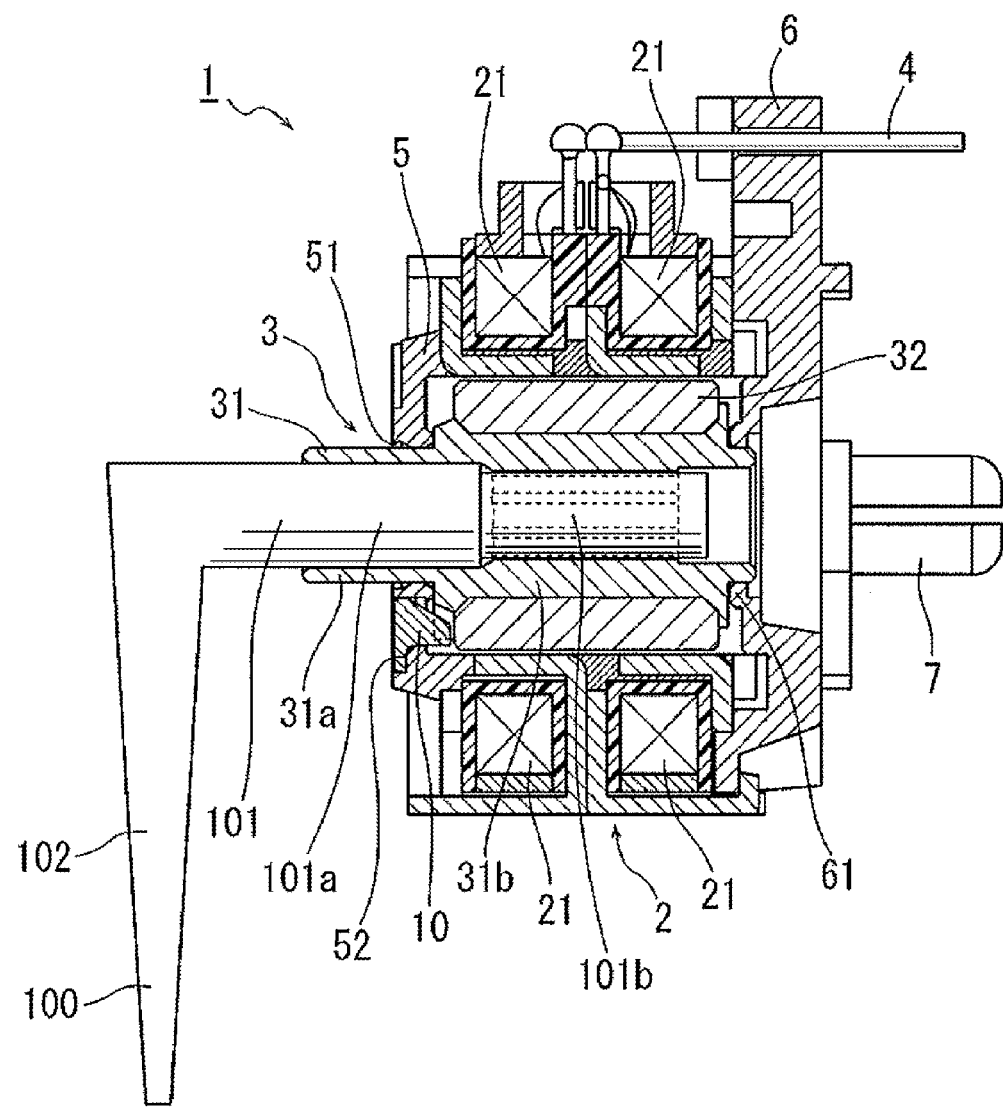
FIG. 3 illustrates a sectional view taken along a line III-III of the stepping motor for a meter of FIG. 2.

Also, FIG. 3 illustrates a sectional view taken along a line III-III of the stepping motor for a meter of FIG. 2.

A stepping motor 1 for a meter according to an illustrative embodiment is used as an actuator part in a moveable part of an indicator such as speed meter and tachometer.

The stepping motor 1 for a meter has a stator 2, a rotor 3, a front plate 5 and an end plate 6, and a pointer 100 is fitted to a rotational shaft 31 of the rotor 3.

The stator 2 has excitation coils, 21 to which power is fed from terminals 4, and contains therein the rotor 3. Since the configuration of the stator 2 is the same as the well-known stator, the detailed description thereof is omitted.

The rotor 3 has the rotational shaft 31 and a rotor magnet 32. In the following description, an axially inward part indicates a center part of the rotor, specifically the rotor magnet 32.

As the rotor magnet 32, a sintered ferrite magnet, a rare-earth sintered magnet, a rare-earth bond magnet and the like may be used, for example. It is preferable to use a material that is proof against the melting temperature of a resin in performing an insert molding. The rotor magnet has a cylindrical shape.

The rotational shaft 31 is made of a resin such as thermosetting resin and has a hollow cylindrical shape. As the material of the rotational shaft 31, polycarbonate (PC) may be mainly used. However, liquid crystal polymer (LCP) may be used as a heat resistant material, and when a reflectivity on an inner circumferential surface of the hollow shaft is insufficient, a reflective material may be coated thereon. Accordingly, the resin of the rotational shaft 31 is not specifically limited.

The rotor magnet 32 is integrally molded with the rotational shaft 31 in molding the rotational shaft 31 made of the resin.

An inner circumferential surface of the hollow rotational shaft 31 may be coated with a light reflection material (for example, silver, aluminum and the like). Accordingly, it is possible to reflect the light on the inner circumferential surface of the hollow rotational shaft 31, thereby realizing the efficient light guiding. In the meantime, when the rotational shaft 31 is made of a white resin having high reflectivity for example, it may be possible to realize the efficient light guiding without coating the light reflection material.

The front plate 5 is provided ahead of the stator 2 containing the rotor 3 therein, and the end plate 6 is provided behind the stator. Both the front plate 5 and the end plate 6 are made of resins. The front plate 5 has a shaft hole 51 at its substantial center, which is a penetrated hole, and a through-hole 52 at a radially outer side of the shaft hole 51. The end plate 6 has a shaft hole 61 at its substantial center, which is a penetrated hole, and is fixed to a substrate by a fixture 7.

Both end portions of the rotational shaft 31 are respectively inserted into the shaft hole 51 of the front plate 5 and the shaft hole 61 of the end plate 6. Connection portions between the shaft hole 51 and shaft hole 61 and the rotational shaft 31 are respectively applied with lubricant and the like so that the shaft hole 51 and the shaft hole 61 function as bearings.

As specifically described later, a stopper pin 10 made of a resin is inserted and is welded in the through-hole 52. In this illustrative embodiment, the stopper pin 10 is made of the resin. However, this disclosure is not limited thereto. For example, the stopper pin may be made of metal, ceramic and the like. When the stopper pin 10 is made of metal, ceramic and the like, the stopper pin 10 may be fixed by the well-known connection method other than the welding.

The pointer 100 has a shaft part 101 that is inserted into the rotational shaft 31, and a pointing part 102 extending in a diametrical direction about the shaft part 101. The shaft part 101 is a shaft having a circular section extending into a cylindrical shape and has a small diameter portion 101b at its leading end and a large diameter portion 101a at its base.

The inner periphery of the hollow rotational shaft 31 has a large diameter portion 31a that is opened with a large diameter to the front plate 5 and a small diameter portion 31b at the axially inward part, which is opened with a small diameter. The opening of the large diameter portion 31a has a circular section and the opening of the small diameter portion 31b has a polygonal section. In this illustrative embodiment, the opening of the smaller diameter portion 31b has an octagonal section. However, the opening of this disclosure is not limited thereto.

The shaft part 101 of the pointer 100 is inserted from the large diameter portion 31a of the hollow rotational shaft 31 and the small diameter portion 101b of the pointer 100 having the circular section is fitted in the small diameter portion 31b having the polygonal section of the rotational shaft 31, so that the pointer 100 is fixed in the rotational shaft 31. According to this fitting, since the opening of the small diameter portion 31b has the polygonal section and the small diameter portion 101b has the circular section, an inner surface of the small diameter portion 31b and an outer surface of the small diameter portion 101b are not excessively closely contacted to each other, so that appropriate fixing force is generated between the pointer 100 and the rotational shaft 31. That is, the pointer 100 can be rotated as the rotational shaft 31 is rotated. Also, when pulling out the pointer 100 from the rotational shaft 31 for repair, replacement and the like, it is possible to easily pull out the pointer since the pointer is not excessively closely contacted to the rotational shaft.

The configuration of the rotor 3 will be described in below.

Figure 4A:
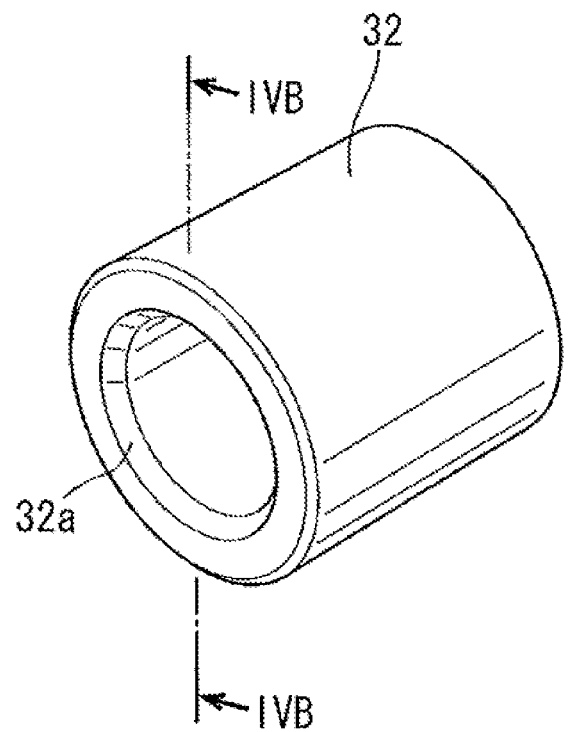
Figure 4B:
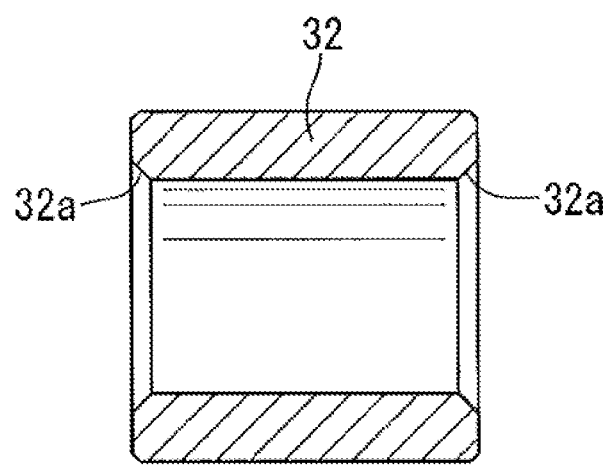

FIGS. 4A and 4B illustrate the rotor magnet 32 of the stepping motor 1 for a meter shown in FIG. 1, wherein FIG. 4A illustrates a perspective view of the rotor magnet 32 and FIG. 4B illustrates a sectional view taken along a line IVB-IVB of FIG. 4A.

The rotor magnet 32 has a cylindrical shape as described above and is provided with tapered portions 32a at both end portions of an inner periphery thereof. By the tapered portions 32a, it is possible to improve the easy supply of the resin in integrally-molding the rotational shaft 31 with the rotor magnet 32 and to prevent deviation of the rotor magnet 32 and the rotational shaft 31 in an axial direction.

The rotor magnet 32 and the rotational shaft 31 are integrated by an insert molding method, thereby configuring the rotor 3. The rotor 3 is more specifically described with reference to FIG. 5.

Figure 5A:
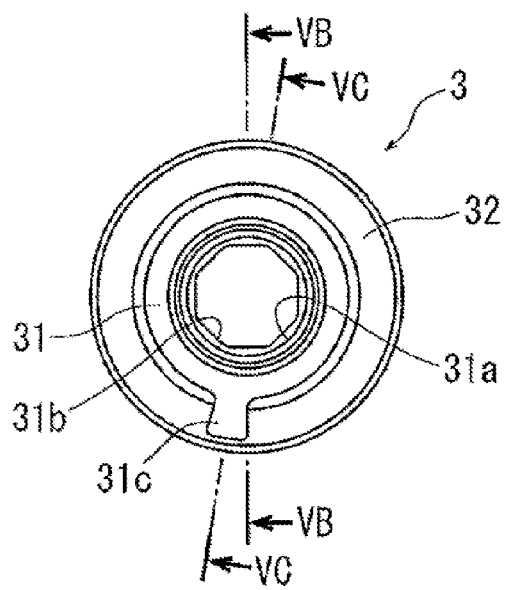
Figure 5B:
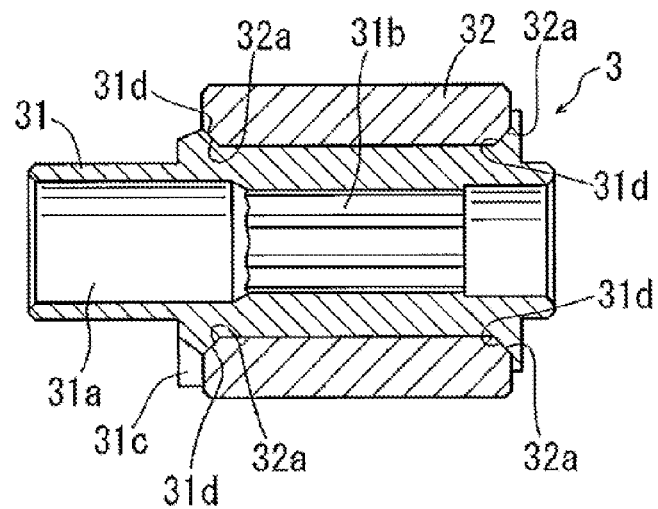
Figure 5C:
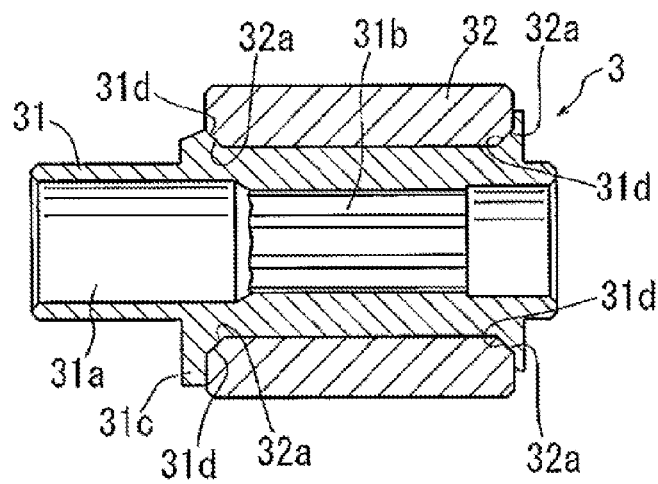

FIGS. 5A, 5B, and 5C illustrate the rotor 3 of the stepping motor 1 for a meter shown in FIG. 1, wherein FIG. 5A illustrates a side view as viewed from an attachment side of the front plate 5, FIG. 5B illustrates a sectional view taken along a line VB-VB of FIG. 5A and FIG. 5C illustrates a sectional view taken along a line VC-VC of FIG. 5A In this illustrative embodiment, the rotor 3 is formed by integrally-molding the rotor magnet 32 with the rotational shaft 31 made of the resin such as PC or LCP. At this time, in this illustrative embodiment, as shown in FIG. 5, the rotational shaft 31 is formed on an inner periphery of the rotor magnet 32. However, this disclosure is not limited thereto. For example, the rotational shaft 31 may be formed around the rotor magnet 32 so that it is coaxial with the rotor magnet 32.

In this illustrative embodiment, the rotor 3 is formed with the rotational shaft 31 so that it matches the inner periphery of the rotor magnet 32, and the rotational shaft 31 is provided with holding portions 31d at positions facing the tapered portions 32a formed at both end portions of the rotor magnet 32 in the axial direction. As the tapered portions 32a and the holding portions 31d are contacted to each other, the deviation of the rotor magnet 32 and the rotational shaft 31 in the axial direction is prevented.

As described above, the inner periphery of the hollow rotational shaft 31 has the large diameter portion 31a that is opened with the large diameter and the small diameter portion 31b that is opened with the small diameter at the more inward side than the large diameter portion 31a. The opening of the small diameter portion 31b may have an octagonal section, and the transition from the large diameter of the large diameter portion 31a to the small diameter of the small diameter portion 31b may be gradual by providing a taper.

Also, the rotational shaft 31 has a stopper part 31c at a side to which the front plate 5 is attached. The stopper part radially protrudes from the rotational shaft 31 at a predetermined circumferential position of the rotational shaft 31. The stopper part 31c is also integrally molded when molding the rotational shaft 31.

Figure 6:
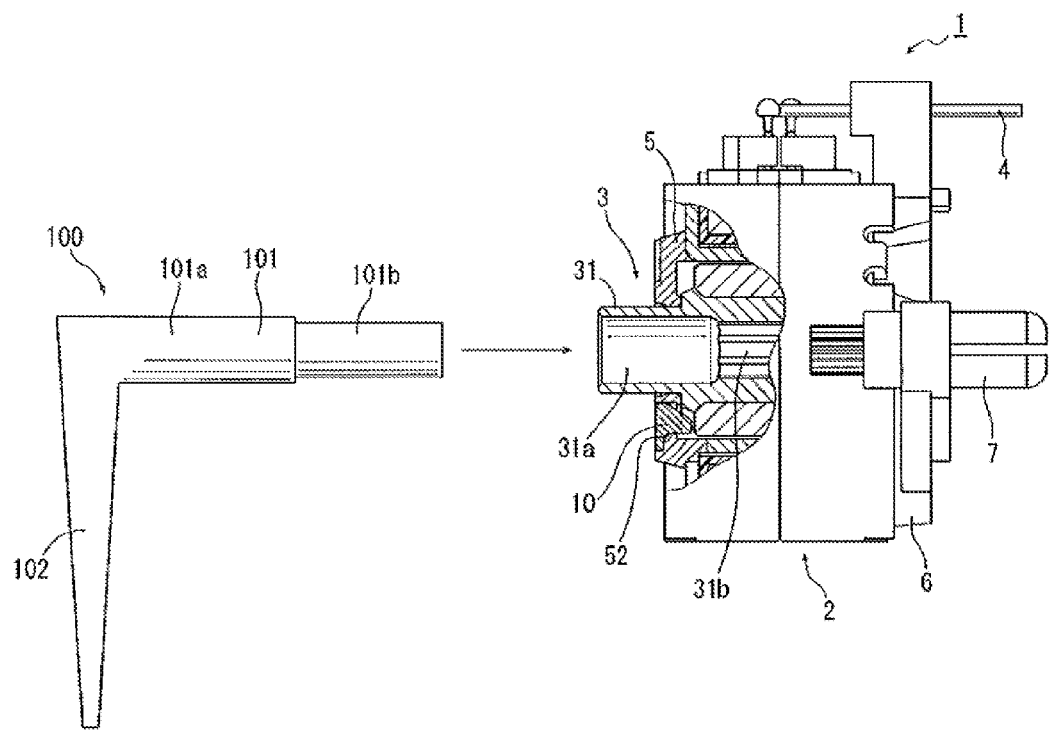
FIG. 6 is a side view illustrating a state in which a stator, a front plate and an end plate are assembled to the rotor shown in FIG. 5, wherein a fitting part of the rotor and a pointer is illustrated as a sectional view with being notched.

FIG. 6 is a side view illustrating a state in which the stator 2, the front plate 5 and the end plate 6 are assembled to the rotor 3 shown in FIG. 5, wherein a fitting part of the rotor 3 and the pointer 100 illustrated as a sectional view with being notched.

The front plate 5 and the end plate 6 are fixed to the stator 2, and the rotational shaft 31 of the rotor 3 is rotatably supported in the shaft hole 51 of the front plate 5 and the shaft hole 61 of the end plate 6.

The through-hole 52 of the front plate 5 is formed at a position corresponding to a radial position of the stopper part 31c, and the stopper pin 10 is inserted into the through-hole 52 of the front plate 5 and welded. At this time, the inserted leading end of the stopper pin 10 protrudes to axially inward side and substantially reaches the end portion at the front plate 5 side of the rotor magnet 32. When the rotor 3 is rotated and the stopper part 31c is rotated in the circumferential direction and then the circumferential position of the stopper part 31c is reached the protrusion position of the stopper pin 10, the stopper part contacts with the stopper pin and cannot be further rotated. It is not necessary for the motor for a meter to rotate by one or more revolutions. Therefore, in this illustrative embodiment, it is possible by the above structure to detect an electrical position of the rotor 3 (pointer 100) and to define a zero position of the meter, for example.

In the meantime, since the stopper pin 10 is fixed to the front plate by the welding after the motor rotation inspection (which inspects whether the motor rotates without a problem), it is possible to detect a problem (for example, the motor is not rotated, the rotation thereof is not uniform) during the manufacturing and to thus prevent the inferior goods from being distributed.

The pointer 100 is attached to the rotor 3 by inserting the small diameter portion 101b, which is the leading end of the shaft part 101 of the pointer 100, into the small diameter portion 31b that is opened with the small diameter at the axially inward side of the hollow rotational shaft 31 of the rotor 3. Since the opening of the small diameter portion 31b has the polygonal section such as octagon, the outer periphery of the small diameter portion 101b is fixed on the inner periphery of the small diameter portion 31b but is not excessively closely contacted thereto, so that it is possible to easily pull out or insert the pointer 100.

Figure 7A:
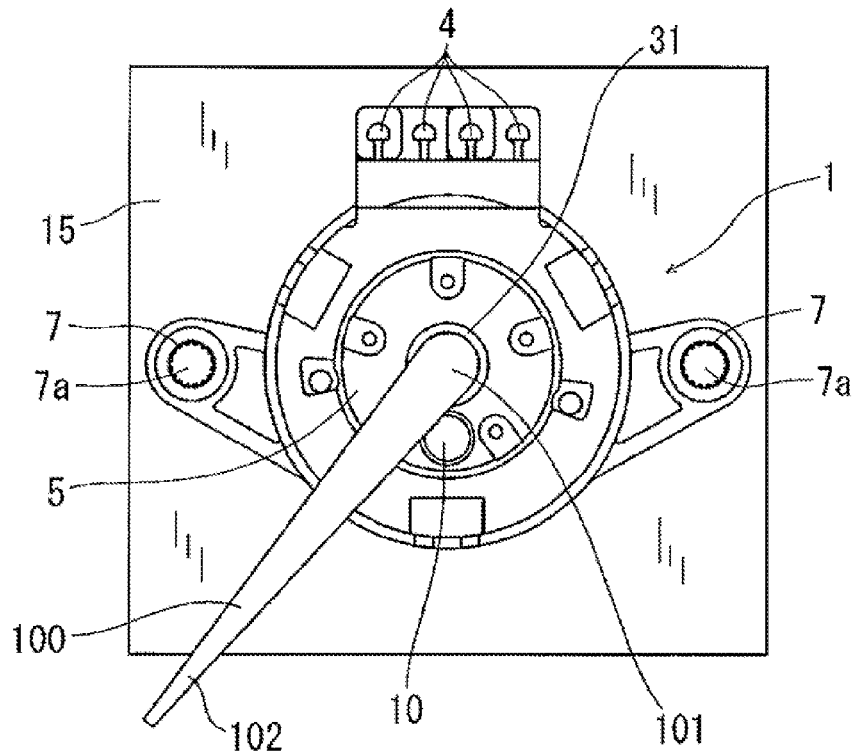
Figure 7B:
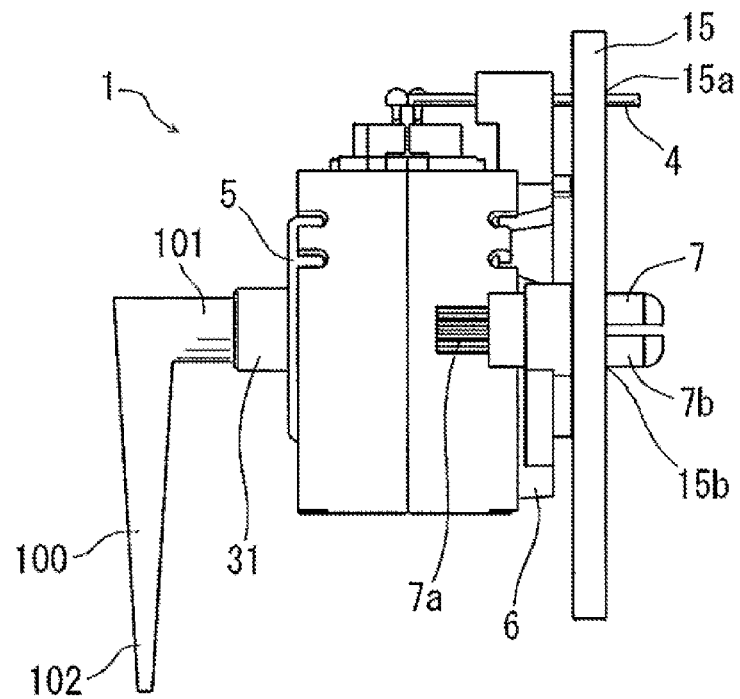

FIGS. 7A and 7B illustrate a state in which the stepping motor 1 for a meter shown in FIG. 1 is mounted on a substrate, wherein FIG. 7A illustrates a front view as viewed from the pointer 100 and FIG. 7B illustrates a side view.

A substrate 15 has pin holes 15a for connecting the terminals 4 of the stepping motor 1 for a meter and through-holes 15b for fixing with the fixture 7.

The terminals 4 are inserted into the pin holes 15a and then connected and fixed by soldering.

The end plate 6 of the stepping motor 1 for a meter is fixed to the substrate 15 by the fixture 7. The fixture 7 has stud pins 7a and anchors 7b. In this illustrative embodiment, in order to fix the stepping motor 1 for a meter to the substrate 15 in high precision, the anchors 7b are provided at a plurality of positions (two positions, in this illustrative embodiment). The anchor 7b is a claw that is divided into a plurality of parts (four parts, in this illustrative embodiment). At a state in which the claw is closed, the stepping motor is inserted into the through-holes 15b. Then, the stud pins 7a are inserted and the anchors 17b are enlarged to fix the end plate 6 to the substrate 15. At this time, the end plate is fixed with force that prevents the anchors 7b from falling out by the force applied during pulling out or fitting the pointer 100.

A position of the substrate 15 corresponding to the shaft hole 61 of the end plate is mounted with a light source (not shown) such as LED, so that it is possible to enable the pointer 100 to emit the light through the hollow space of the rotational shaft 31. At this time, the shaft hole 61 preferably has a size capable of containing the light source.

Figure 8:
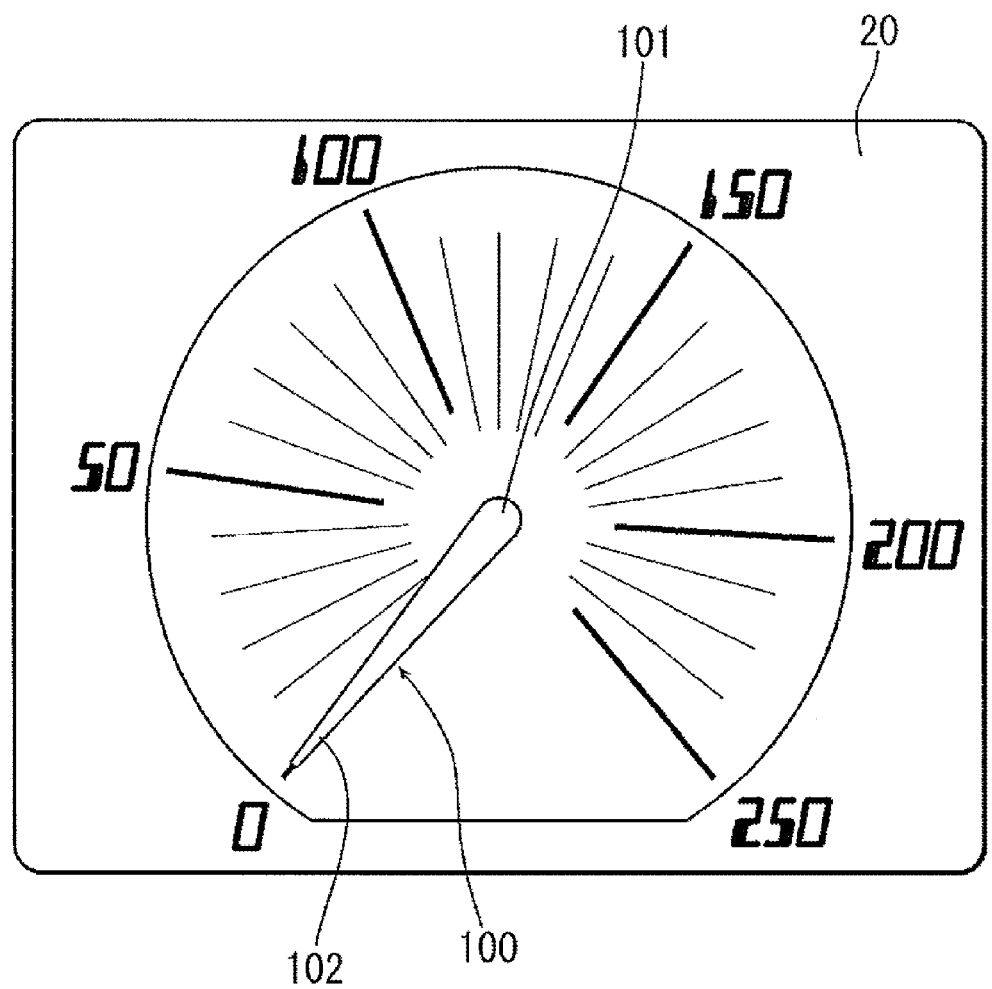
FIG. 8 is a front view illustrating a state in which the stepping motor for a meter shown in FIG. 1 is attached on a meter panel surface.

FIG. 8 is a front view illustrating a state in which the stepping motor 1 for a meter shown in FIG. 1 is attached on a meter panel surface.

A meter panel surface 20 is marked with values for indicating speed and the like depending on indication positions of the pointer 100.

Although the stepping motor for a meter of this disclosure has been described, this disclosure is not limited thereto. It should be understood that a variety of modifications and combinations can be made without departing from the scope of this disclosure.

For example, both the stopper pin and the stopper part are provided in a side of the front plate in the illustrative embodiment. However the both the stopper pin and the stopper part may be provided in a side of the end plate.

What is claims is:

1. A stepping motor for a meter to rotate a pointer of the meter, the stepping motor for a meter comprising:
a rotor part comprising:
a cylindrical magnet; and
a rotational shaft being hollow and made of a resin, wherein the rotational shaft is molded on an inner periphery of the cylindrical magnet and is coaxial with the cylindrical magnet;
wherein a stopper part is provided to the rotational shaft,
wherein a stopper pin is provided on a position corresponding to a radial position of the stopper part that is rotated with rotating of the rotational shaft, and
wherein the rotation of the rotational shaft is restrained by contacting of the stopper part with the stopper pin,
a stator part that contains the rotor part therein and has an excitation coil;
a front plate made of a resin, and
an end plate made of a resin,
wherein a holding portion provided to fix the cylindrical magnet is molded when molding the rotational shaft, and
wherein the cylindrical magnet is fixed by the holding portion so that the cylindrical magnet and the rotational shaft are integrated with omitting a sleeve.

2. The stepping motor for a meter according to claim 1, wherein the rotational shaft forms a hollow space, wherein a cross section of the hollow space perpendicular to an axial direction has a polygonal shape, and
wherein the pointer is fitted into the hollow space of the rotational shaft and is thus fixed to the rotational shaft.

3. The stepping motor for a meter according to claim 1, wherein the stopper part is a protruding part and protrudes outward in a radial direction; and
wherein the stopper pin is inserted in a hole provided to the front plate or end plate so that it protrudes inward in the axial direction.

4. The stepping motor for a meter according to claim 1, wherein both a penetrated hole formed in the front plate and a penetrated hole formed in the end plate are configured to function as bearings for supporting the rotational shaft.

5. The stepping motor for a meter according to claim 1, wherein an inner circumferential surface of the hollow rotational shaft is coated with a light reflecting material.

6. A stepping motor for use as part of a meter to rotate a pointer of the meter, the stepping motor comprising:
a rotor part comprising:
a cylindrical magnet; and
a rotational shaft being a unitary construction made of a resin and having a hollow interior area formed therein, wherein the rotational shaft is molded on an inner periphery of the cylindrical magnet and is coaxial with the cylindrical magnet;
wherein a stopper part is provided to the rotational shaft,
wherein a stopper pin is provided on a position corresponding to a radial position of the stopper part that is rotated with rotating of the rotational shaft, and
wherein the rotation of the rotational shaft is restrained by contacting of the stopper part with the stopper pin,
a stator part that contains the rotor part therein and has an excitation coil;
a pointer comprising a pointing part and a shaft part;
a front plate made of a resin, and
an end plate made of a resin,
wherein:
a holding portion provided to fix the cylindrical magnet is molded when molding the rotational shaft,
the cylindrical magnet is fixed by the holding portion so that the cylindrical magnet and the rotational shaft are integrated, and
the shaft part of the pointer is inserted into the hollow interior area of the rotational shaft, and is in direct contact with the rotational shaft.

* * * * *